(12) United States Patent
Iida et al.

(10) Patent No.: US 7,151,319 B2
(45) Date of Patent: Dec. 19, 2006

(54) SEMICONDUCTOR DEVICE

(75) Inventors: Takashi Iida, Tsuchiura (JP); Tatsuya Nagata, Ishioka (JP); Seiji Miyamoto, Tachikawa (JP); Toshihiro Matsunaga, Iruma (JP)

(73) Assignee: Hitachi, Ltd., Tokyo (JP)

( * ) Notice: Subject to any disclaimer, the term of this patent is extended or adjusted under 35 U.S.C. 154(b) by 123 days.

(21) Appl. No.: 10/876,462

(22) Filed: Jun. 28, 2004

(65) Prior Publication Data

US 2005/0017357 A1 Jan. 27, 2005

(30) Foreign Application Priority Data

Jun. 27, 2003 (JP) ............... 2003-183716

(51) Int. Cl.
*H01L 23/52* (2006.01)
*H01L 23/48* (2006.01)
*H01L 29/40* (2006.01)

(52) U.S. Cl. .............. 257/786; 257/738; 257/758; 438/612; 174/262; 174/255; 361/780; 361/794

(58) Field of Classification Search ........ 257/E23.067, 257/E23.07, E23.079, 738, 758, 748, 786, 257/774–776; 438/612; 174/262, 255; 361/780, 361/794
See application file for complete search history.

(56) References Cited

U.S. PATENT DOCUMENTS

| | | | | |
|---|---|---|---|---|
| 5,487,218 A | * | 1/1996 | Bhatt et al. ................ 29/852 |
| 5,637,920 A | * | 6/1997 | Loo ............................ 257/700 |
| 6,052,287 A | * | 4/2000 | Palmer et al. .............. 361/767 |
| 6,075,710 A | * | 6/2000 | Lau ............................. 361/760 |
| 6,696,763 B1 | * | 2/2004 | Chen et al. ................. 257/778 |
| 6,946,738 B1 | * | 9/2005 | Hsu et al. ................... 257/774 |
| 2004/0061241 A1 | * | 4/2004 | Osburn et al. ............. 257/786 |
| 2004/0184219 A1 | * | 9/2004 | Otsuka et al. ........... 361/306.3 |
| 2004/0226742 A1 | * | 11/2004 | Wyrzykowska et al. .... 174/260 |

FOREIGN PATENT DOCUMENTS

| | | | |
|---|---|---|---|
| JP | 7-153869 | | 6/1995 |
| JP | 11121524 A | * | 4/1999 |

* cited by examiner

*Primary Examiner*—Kenneth Parker
*Assistant Examiner*—Chris C. Chu
(74) *Attorney, Agent, or Firm*—Antonelli, Terry, Stout and Kraus, LLP.

(57) ABSTRACT

A BGA semiconductor device for high-speed operation and high pin counts has a base which is constituted by a core layer formed of wiring boards and surface layers provided on both sides of the core layer, and a semiconductor element mounted on the base. Through holes in a signal region of the core layer are disposed in an optimum through hole pattern in which power through holes and ground through holes are disposed adjacent to signal through holes.

12 Claims, 18 Drawing Sheets

REGION B

4s SIGNAL THROUGH HOLE
4v POWER THROUGH HOLE
4g GROUND THROUGH HOLE 300a, 301a FIRST SIGNAL UNIT
302a, 303a SECOND SIGNAL UNIT
300b, 301b, 302b, 303b BOUNDARY SIGNAL UNIT

US 7,151,319 B2

SEMICONDUCTOR DEVICE

BACKGROUND OF THE INVENTION

The present invention relates to a semiconductor device and, more particularly, to a semiconductor device in which a semiconductor element is mounted on a base having external terminals.

A BGA package has been widely used, since it is appropriate for a higher pin count package, and its inductance and noise is small because its power and ground is planar. However, with an increase in speed of operation frequency of the semiconductor device, electrical noise is increasing in ground even if the BGA package is used.

As a semiconductor device for reducing the electric noise, there is a well-known example in which multiple through holes are provided in a ground pattern as disclosed in JP-A-7-153869.

While the above known example discloses a structure to reduce ground inductance due to noise by providing multiple through holes on the ground, the noise can not be reduced sufficiently when operation becomes faster.

The inductance can be reduced by increasing the proportion of the number of power through holes and ground through holes relative to the number of signal through holes. In the through hole layout structure, the proportion of the number of the power through holes and ground through holes relative to the number of signal through holes has an significant effect on the number of total pins. If the number of the power and ground through holes per one signal through hole is large, the inductance is significantly reduced. However, manufacturing costs for the semiconductor device will be raised. If the number of the power and ground through holes per one signal through hole is small, then the inductance is not so reduced, although its production costs are decreased.

Therefore, just the provision of multiple ground through holes results in an enlarged and complicated package, even if high-speed operation is achieved.

Accordingly, it is an object of the present invention to provide a compact semiconductor device capable of suppressing an increase in noise to perform high-speed transmission.

SUMMARY OF THE INVENTION

The present invention for solving the above problems will be described below.

(1) A semiconductor device is provided that has a base on which a plurality of through holes are formed, including signal through holes, power through holes, and ground through holes. The power through holes or ground through holes are diagonally disposed around the signal through holes such that they are connected.

Specifically, the semiconductor device, characterized in that it has a semiconductor element, and a base which includes the semiconductor element mounted on the main surface thereof and external terminals provided on a surface opposite to the main surface, the base having a region where multiple grid-shaped through holes comprising a conductive member for electrically connecting the main surface and the opposing surface are disposed, wherein:

the through hole includes a signal through hole, a first power through hole of a first potential, a second power through hole of a second potential which is lower than the first potential;

the base comprises: a first through hole; a first through hole string which includes the first through hole and is disposed in a first direction; a second through hole string and a third through hole string which are disposed in a first direction each adjacent to both sides of the first through hole string; a fourth through hole string which includes the first through hole and is disposed in a second direction, different from the first direction; and a fifth through hole string and a sixth through hole string which are disposed in the second direction each adjacent to both sides of the fourth through hole string; and the base further has a through hole unit in which a first power through hole and a second power through hole are diagonally disposed at the through holes, which are positioned at an intersection point of the second through hole string, the third through hole string, the fifth through hole string, and the sixth through hole string.

Moreover, the semiconductor device is characterized in that a through hole which is adjacent to the first signal through hole in the first direction is a signal through hole, and a through hole which is adjacent to the first signal through hole in the second direction is also a signal through hole.

Additionally, a power through hole of a first potential may be, for example, a so-called power through hole, while the power through hole of a second potential may be a so-called ground through hole.

(2) Furthermore, the semiconductor device is characterized as follows:

the through hole comprises a signal through hole, a first power through hole of a first potential, and a second power through hole of a second potential which is lower than the first potential;

the base has a through hole unit that comprises a signal through hole, a first power signal through hole, and a second power signal through hole;

the first a through hole unit comprises: a first through hole; a first through hole string which includes the first through hole and is disposed in a first direction; a second through hole string and a third through hole string which are disposed in the first direction adjacent to both sides of the first through hole string; a fourth through hole string which includes the first through hole and is disposed in a second direction, different from the first direction; and a fifth through hole string and a sixth through hole string which are disposed in the second direction each adjacent to both sides of the fourth through hole string;

the first power through hole and the second power through hole are disposed diagonally at the through hole, which is positioned at an intersection point of the second through hole string, the third through hole string, the fifth through hole string and the sixth through hole string;

the second through hole unit comprises: a second through hole; a seventh through hole string which includes the second through hole and is disposed in the first direction; a eighth through hole string and a ninth through hole string which are disposed in the first direction each adjacent to both sides of the seventh through hole string; a tenth through hole string which includes the second through hole and is disposed in the second direction; and a eleventh through hole string and a twelfth through hole string which are disposed in the second direction each adjacent to both sides of the tenth through hole string;

the first power through hole and the second power through hole are diagonally disposed at the through hole positioned at an intersection point of the eighth through hole string, the ninth through hole string, the eleventh through hole string, and the twelfth through hole string; and a through hole constituting one side of the first through hole unit and a through hole constituting the second through hole unit are disposed such that they are common.

(3) Alternatively, the semiconductor device, characterized in that it has a region where a through hole unit is formed, and a region where a through hole unit is not formed, wherein signals flowing in the through hole that constitutes the first through hole unit is faster than those flowing in the through hole that does not constitute the through hole unit.

Alternatively, the semiconductor device may include a region disposed such that data signals or clock signals flow to the through holes which constitute the first through hole unit, and address signals flow to the through holes which do not constitute the through unit.

Alternatively, more specifically, one signal through unit has one each of power through hole and ground through hole at a position horizontally or vertically adjacent to the signal through hole in a group of the grid-shaped through holes that are nearest the signal through holes. Another one signal through unit has two pieces each of the power through hole and ground through hole at a position where signal through holes are diagonally placed in a group of grid-shaped through holes that are nearest the signal through holes. External terminals of the semiconductor device have a bus 1 which is a group of transmission paths for simultaneously transmitting signals that are of the same kind and have a signal wavelength voltage that is significantly higher than noise voltage, and have a bus 2 which is a transmission group for transmitting signal of the same kind and has many noises. The through hole on the signal transmission path of the bus 1 may comprise the first signal through unit and second signal through unit.

Moreover, one signal through unit has one each of power through hole and ground through hole at a position horizontally or vertically adjacent to the signal through hole in a group of the grid-shaped through holes that are nearest the signal through holes. Another one signal through unit has two pieces each of power through hole and ground through hole at a position where signal through holes are diagonally placed in a group of grid-shaped through holes that are nearest the signal through holes. External terminals of the semiconductor device have a transmission path 1 which is a high-speed signal transmission path, and a transmission path 2 which is a low-speed signal transmission path. The through hole on the signal transmission path of the signal path 1 may comprise the first signal through hole unit and second signal through hole unit.

(4) Alternatively, power and ground through holes are disposed on a position adjacent to the direction in which the signal through hole grids are disposed.

Specifically, a semiconductor device having a semiconductor element and a base, characterized as follows:

the through holes comprise a signal through hole, a first power through hole of a first potential, and a second power through hole of a second potential which is lower than the first potential;

the base comprises: a first through hole; a first through hole string which includes the first through hole and is disposed in a first direction; a second through hole string and a third through hole string which are disposed in the first direction each adjacent to both sides of the first through hole string; a fourth through hole string which includes the first through hole and is disposed in a second direction, different from the first direction; and a fifth through hole string and a sixth through hole string which are disposed in the second direction each adjacent to both sides of the fourth through hole string; and the semiconductor device has a through hole unit formed such that through holes disposed adjacent to the first direction containing the first through hole therebetween are the first power through hole and the second power through hole, through holes disposed adjacent to the second direction containing the first through hole therebetween are a signal through hole, and signal through holes positioned at a point of intersection of the second through hole string, the third through hole string, the fifth through hole string, and sixth through hole string are signal through holes.

(5) It is preferable that in the above (1) to (4), the semiconductor device is characterized in that 70% or more of the through holes, which are disposed in a region that is separated by a diagonal line of the base and a line connecting a central part of a side opposite to the main side, or a region between a through hole string that includes signal through holes on the most peripheral side and is disposed in a direction along a side opposite to the outer periphery, and a through hole string that includes signal through holes on the side nearest the center and is disposed in a direction along a side opposite to the outer periphery, are comprised of the through hole units.

(6) Alternatively, a semiconductor device having a semiconductor element and the base, characterized in that the through holes comprise a signal through hole, a first power through hole of a first potential, a second power through hole of a second potential which is lower than the first potential;

the base comprises: a first through hole; a first through hole string which includes the first through hole and is disposed in a first direction; a second through hole string and a third through hole string which are disposed in the first direction each adjacent to both sides of the first through hole string and include both a first through hole and a second through hole; a fourth through hole string which includes the first through hole and is disposed in a second direction, perpendicular to a first direction; and a fifth through hole string and a sixth through hole string which are disposed in the second direction each adjacent to both sides of the fourth through hole string and include both a first power through hole and a second power through hole;

the second through hole string, third through hole string, fifth through hole string, and sixth through hole string have a region where a second signal through hole is disposed to the first signal through hole via a first power through hole, and a third power through hole is disposed to the second signal through hole via second power through hole; and the region has an area therein where a first power through hole of the second through hole string and a second power through hole of the third through hole string are disposed adjacent to a signal through hole of the first through hole string, and further has an area where a first power through hole of the fifth through hole string and a second power through hole of the sixth through hole string are disposed adjacent to a signal through hole of the fourth through hole string.

Alternatively, a semiconductor having a semiconductor element, and a base, characterized in that the through hole comprises: a signal through hole; a first power through hole of a first potential; and a second power through hole of a second potential lower than the first potential, and the through hole has: a first signal through hole unit, and a second signal through hole unit, in which a first power through hole and a second power through hole are each disposed at a position in the direction along a first signal through hole and a grid string of the first signal through hole in the through holes disposed at a position which is nearest and surrounds the first through hole; a second signal through hole unit in which an angle portion of the through holes disposed at a position which is nearest and surrounds the first signal through hole comprises a first power through hole and a second power through hole; and the first trough hole unit and second through hole unit in a region between each side of the semiconductor element on the base and an opposite peripheral side of the base.

The base may also comprise a plurality of the through hole units. For example, it may comprise the through hole units on each of the regions opposite to the main side of the semiconductor element.

Alternatively, power through holes and ground through holes may be vertically and horizontally alternately spaced by two pitches in a grid-shaped through hole layout.

In this way, according to the present invention, it is possible provide a compact semiconductor device capable of reducing noise and performing high-speed transmission.

Alternatively, it is possible to provide a semiconductor device that has the minimum number of through holes compared with the number of signals to reduce electrical noise caused by high-speed operation of a large scale BGA package.

Other objects, features and advantages of the invention will become apparent from the following description of the embodiments of the invention taken in conjunction with the accompanying drawings.

DESCRIPTION OF THE EMBODIMENTS

Embodiments relating to the present invention will be described below with reference to drawings.

Figure 1:
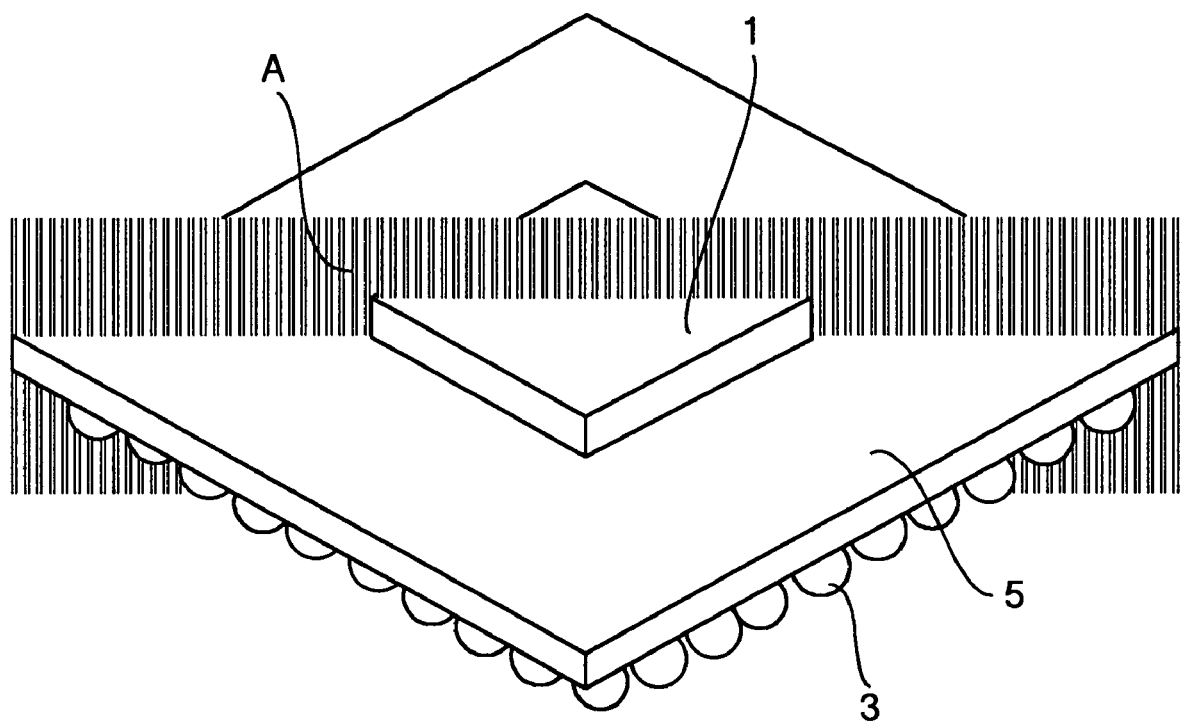
FIG. 1 is a perspective view relating to an embodiment of the present invention.

A perspective view of an embodiment of the present invention is shown in FIG. 1. In the embodiment, a semiconductor element 1 is placed on a base 5 such that it is electrically connected to external terminals of the base 5 of a substrate side. For example, as shown in FIG. 1, solder balls 3 are connected to the external terminals formed on the substrate side of the base 5 for electric connection to the semiconductor element 1.

It should be noted that while a description is given to a configuration in which solder balls are connected to the external terminals in the semiconductor device of the present embodiment, the present invention is not limited to the configuration.

Figure 2:
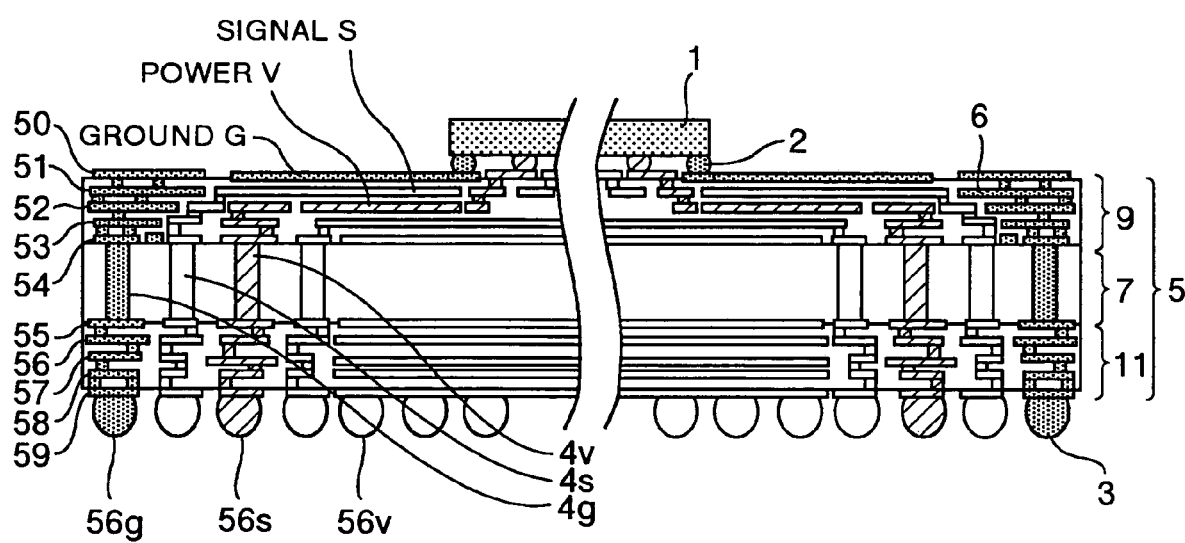
FIG. 2 is a cross sectional view relating to an embodiment of the present invention.

A cross section A is shown in FIG. 2. The semiconductor element 1 is electrically connected to the base 5 via a solder ball 2. The base 5 is connected to the external terminals via conductor layers 50, 51, 52, 53, 54, 55, 56, 57, 58, and 59, vias 6, and through holes 4. The solder ball 3 is used, for example, to connect the BGA semiconductor device to a substrate of an electric apparatus which is not shown here. The base 5 comprises a core layer 7 (800 µm in thickness), and surface layers 9 and 11 (each 200–300 µm in thickness) which are deposited on opposite sides of the core layer. The surface layers 9, 11 have a plurality of conductor layers comprising conductors. The conductor layers 50, 51, 52, 53, 54, 55, 56, 57, 58, and 59 are connected with each other via the vias 6 which are provided between the layers, and the conductor layers 54, 55 are electrically connected via a ground through hole 4g, a signal through hole 4s, and a power through hole 4v that pass through the core layer 7. The surface layers 9, 11 are formed by a build-up method, in which printing is performed one layer by one layer on both sides of the core layer which is made of resin including for example, a glass fiber, or the like. The through holes 4 are typically formed by drilling and plating copper which is a conductive material. Since the through hole is provided by drilling, a pitch of the through holes is sometimes limited to about 0.7 to 1 mm. Only a limited number of through holes can be provided due to the pitch of the through holes in the BGA semiconductor device of the present embodiment. Therefore, the proportion of the number of the signal through holes, power through holes, and ground through holes, as well as their positional relation become important. Signals S of the semiconductor element 1 are typically in one-to-one relation with external terminals of the semiconductor device, and each is connected to a BCA pad 56s. Powers V of the semiconductor element 1 are connected to external terminals 56v of the semiconductor device. Grounds G of the semiconductor element 1 are connected to external terminals 56g of the semiconductor device. The conductor layers 54, 55, which are placed on opposite sides of the core layer 7, are conductor layers which are at the same potential. The conductor layers comprised by the surface layers 9, 11 can be broadly divided into a signal layer, a power layer, and a ground layer. The conductor layers 50, 54, 55, 56, 58, 59 are ground layers, the conductor layers 51, 53 are wring layers, and the conductor layers 52, 57 are power layers.

Figure 3:
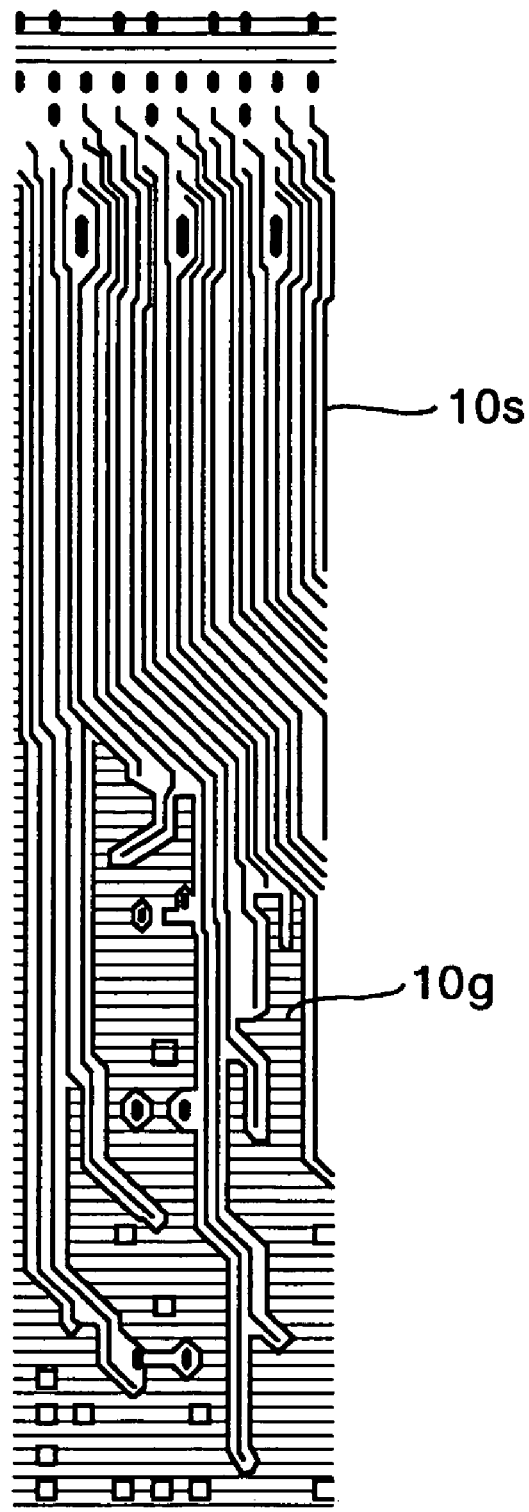
FIG. 3 is a plane view relating to an embodiment of the present invention.

The signals S of the semiconductor element 1 are connected to the external terminals via the solder ball 2, conductor layer 50, via 6, conductor layers 51, via 6, conductor layer 52, via 6, conductor layer 53, via 6, conductor layer 54, signal through hole arranged in grid-shape 4s, conductor layer 55, conductor layer 56, via 6, conductor layer 57, via 6, conductor layer 58, via 6, and conductor layer 59 for pad. FIG. 3 shows part of the top of the conductor layer 51 (wiring). Signal wirings extend from the center of the BGA semiconductor device (top of FIG. 3), where external terminals of the semiconductor element are concentrated like wirings 10s shown in FIG. 3, to peripheral parts of the BGA semiconductor device (bottom of FIG. 3). A part in FIG. 3 where non-dense signal wirings 10s extend toward the periphery is a solid layer of the ground.

A connection path for the power V is power terminals of the semiconductor element 1, the solder ball 2, conductor layer 50, via 6, conductor layer 51, via 6, conductor layer 52 in a solid form, via 6, conductor layer 53, via 6, conductor layer 54, a through hole 4v, the conductor layer 55, via 6, conductor layer 56, via 6, conductor layer 57 in a solid form, via 6, conductor layer 58, via 6, and power BGA pad 56v of the conductor layer 59 for pad.

A connection path for the ground G is a ground terminal of the semiconductor element 1, the solder ball 2, conductor layer 50 in a solid form, via 6, conductor layer 51 in a solid form, via 6, conductor layer 52, via 6, conductor layer 53 in a solid form, via 6, conductor layer 54 in a solid form, a through hole 4g, conductor layer 55 in a solid form, via 6, conductor layer 56 in a solid form, via 6, conductor layer 57, via 6, conductor layer 58 in a solid form, via 6, and ground BGA pad 56g of the conductor layer 59 for a pad.

Figure 4:
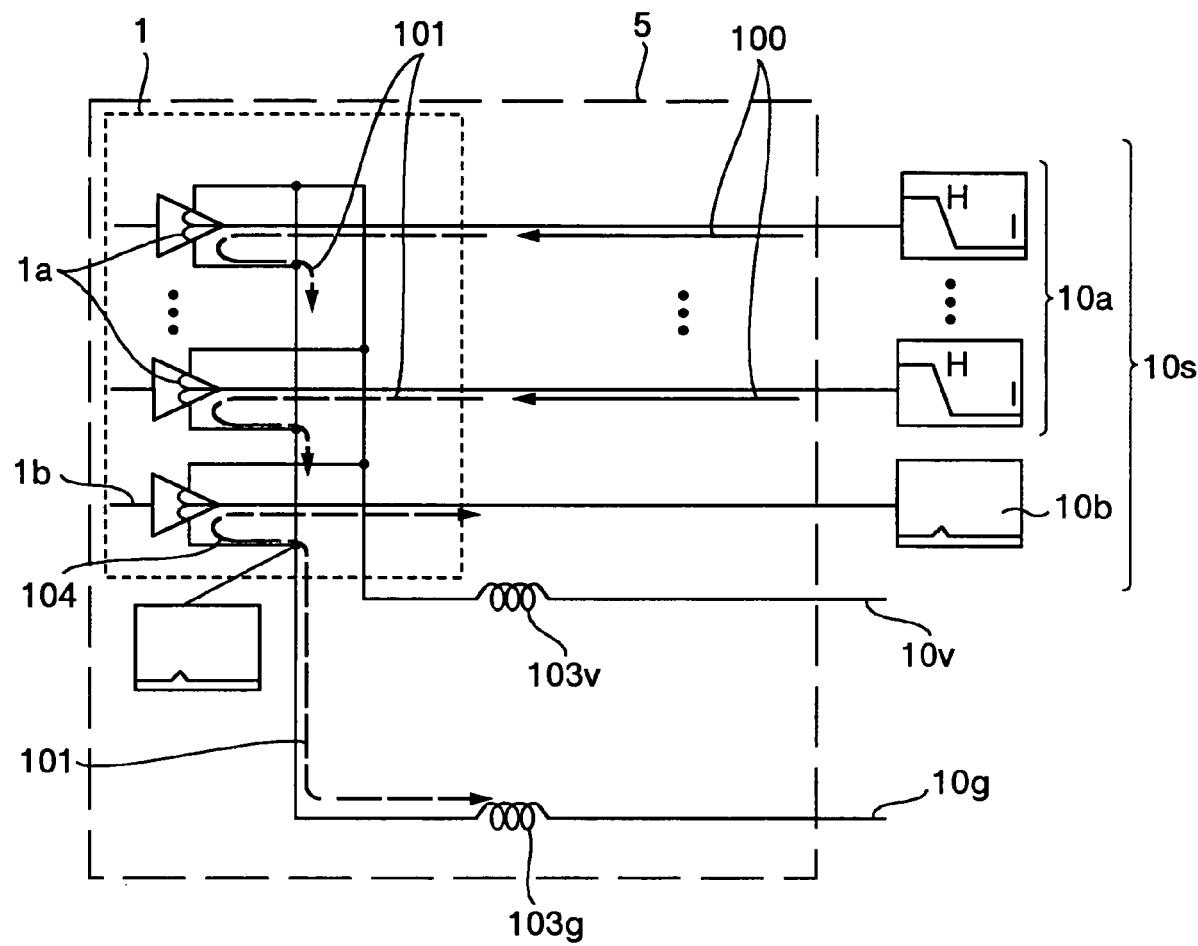
FIG. 4 is a plane view relating to the operating principle of the present invention.

Operation of the semiconductor device will be generally described with reference to FIG. 4. The signal wirings 10s within the base 5 are connected to a drive buffer 1a, and a non-drive buffer 1b, and the power and the ground of the buffer are connected to the power plane 10v, and the ground plane 10g within the base, respectively. When a plurality of the signal wirings are driven simultaneously, a signal current 100 flows into the buffer 1a through the drive wirings 10a. At this time, a transient current flows through the buffer, and a return current 101 flows through the power plane 10v, and ground plane 10g. The power plane 10v, and ground plane 10g have a power inductance 103v, and a ground inductance 103g, respectively. Therefore, the flow of the return current raises their potential. There arises a simultaneous switching noise 104 in the signal wirings 10s connected to the non-drive buffer 1b due to the rise in the potential. The amount of the simultaneous switching noise 104 increases or decreases depending on a rise or a drop in the voltage. Thus, the simultaneous switching noise 104 can be reduced by reducing the power inductance 103v, and ground inductance 103g which cause a rise in voltage.

Figure 5:
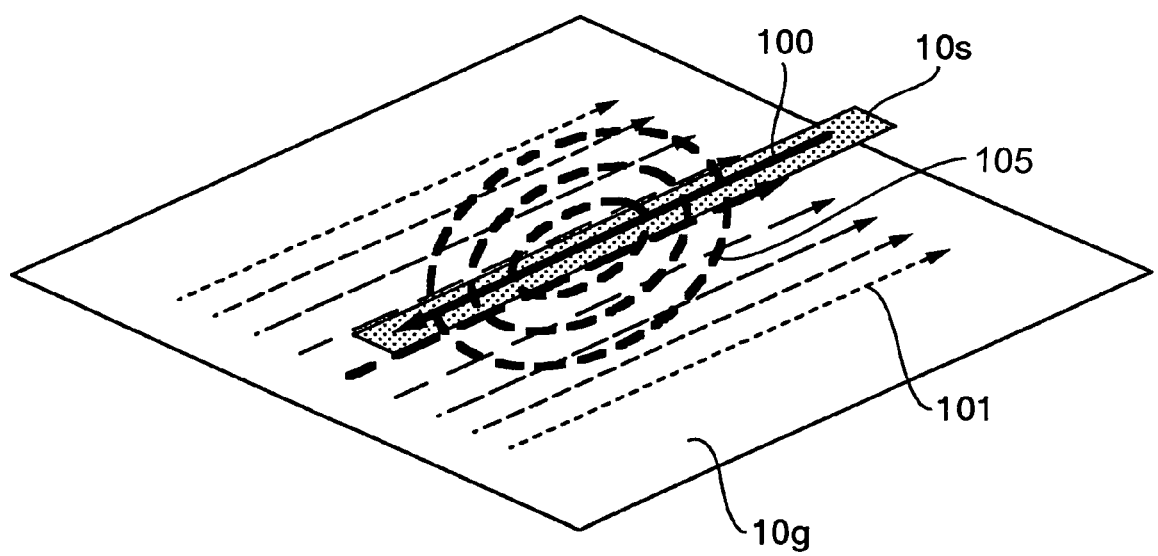
FIG. 5 is a schematic perspective view illustrating current paths.

A relationship between the signal current and return current is described in FIG. 5. When there exists a signal wiring 10s on the ground plane 10g, if a signal current 100 flows to the signal wiring 10s, a return current 101 flows in a direction opposite to that in which the signal current 100 flows. The signal current 100 generates a magnetic field 105 in a direction perpendicular to that in which the signal current flows. Similarly, the return current 101 generates another magnetic field 105 immediately below the signal wiring 10s. Since those magnetic fields are combined with each other, the ground inductance directly below the signal wiring 10s becomes low. The return current 101 inherently can freely flow on the power plane 10g. However, since the ground inductance is low at the ground plane 10g immediately below the wiring, the return current 101 flows intensively there.

Figure 6:
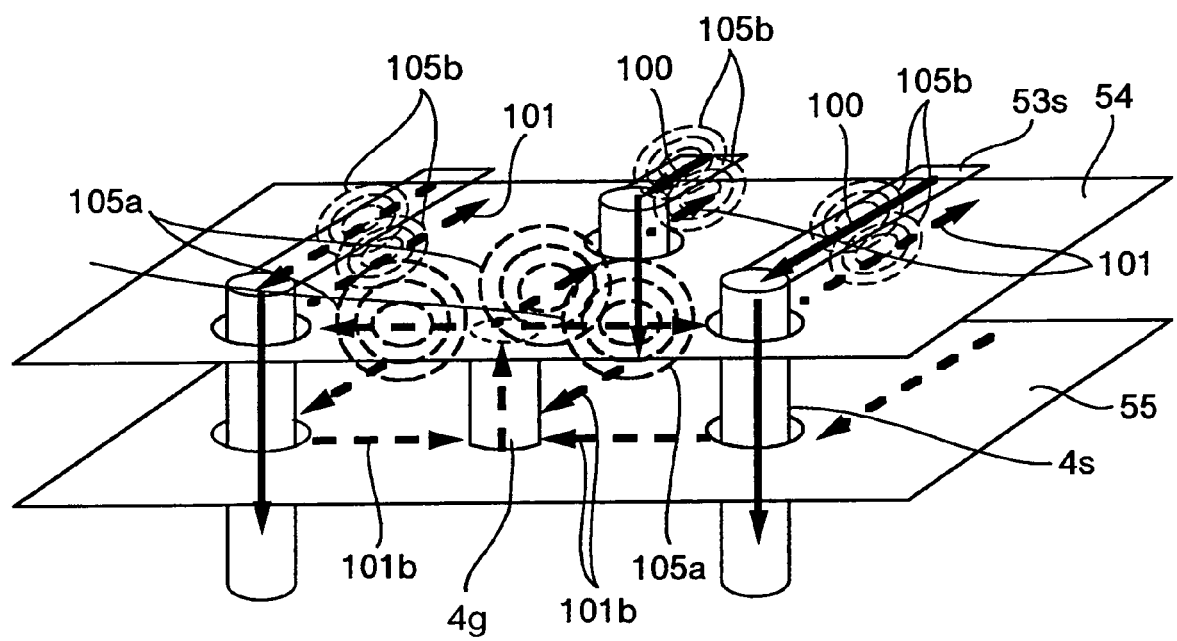
FIG. 6 is a schematic perspective view illustrating current paths.

A relationship between the return current and an uncombined current is shown in FIG. 6. The ground planes 54, 55, which face with each other, are connected via the ground through hole 4g. The signal wirings 53s are connected via the through hole 4s and pass through the ground planes 54, 55. At this time, if the signal current 100 flows to the signal wiring 53s, the return current 101 flows on the ground plane (conductor layer) 54 in a direction opposite to that in which the signal current flows. The return current 101 flows directly below the signal wirings 53s due to a decrease in inductance caused by a combined magnetic field 105b. However, since a magnetic field 105a of an uncombined current 101b that flows toward the ground hole 4g is not combined, the ground inductance becomes high. It has been newly found that the more the uncombined current 101b flows, the more the ground inductance increases.

Figure 7:
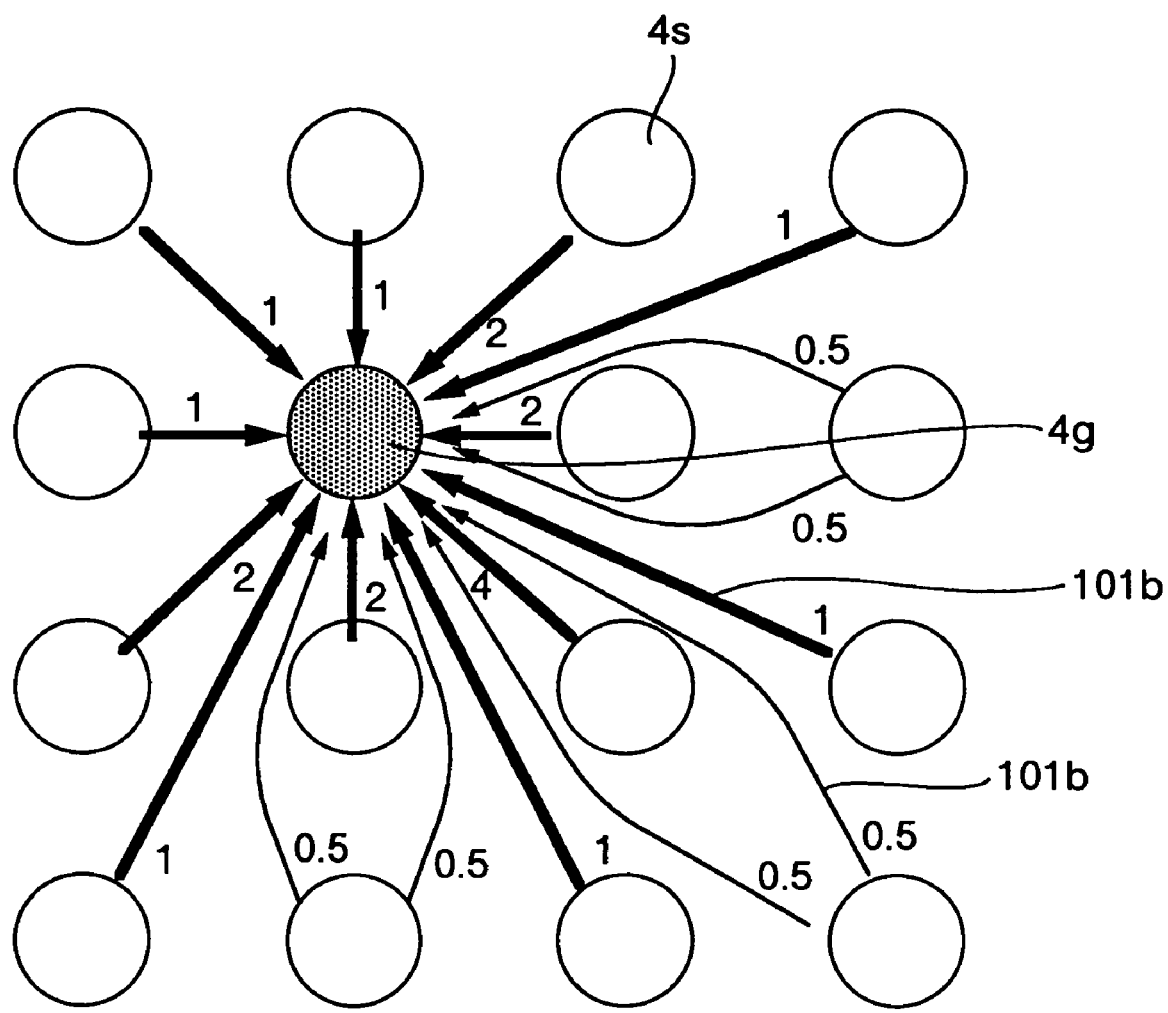
FIG. 7 is a schematic plane view illustrating current paths.

A relationship between the overlap of the uncombined current paths and an increase in inductance is shown in FIG. 7. The uncombined current 101 flows depending on the signal current 100. Accordingly, the larger the number of the signal through holes 4s relative to that of the ground through holes 4g is, the more the uncombined current 101b flows. While the amount of uncombined current flowing to one of the signal through holes 4s remains unchanged, the current paths sometimes overlap when a plurality of the uncombined current 101b concentrate on the ground through holes 4g. Numerical subscripts added to the return current 101 in FIG. 7 show the time of overlapping of the current at that time. It has newly been found that the increase of the inductance is proportional to the distance between the signal through hole 4s and the ground through hole 4g, and that inductances are increased by several times depending on the overlapping of the current even if the distance between the two is the same. Therefore, it becomes important to shorten the distance between the signal through hole 4s and the ground through hole 4g, and to increase the proportion of the number of the ground through holes relative to that of the signal through holes 4s in order to reduce the ground inductance. While a conductor layer that is opposite to the signal wiring is a ground in the above example describing the action, similar action will also be performed when the conductor layer is a power.

Embodiment 1 will be described in detail below.

Figure 8:
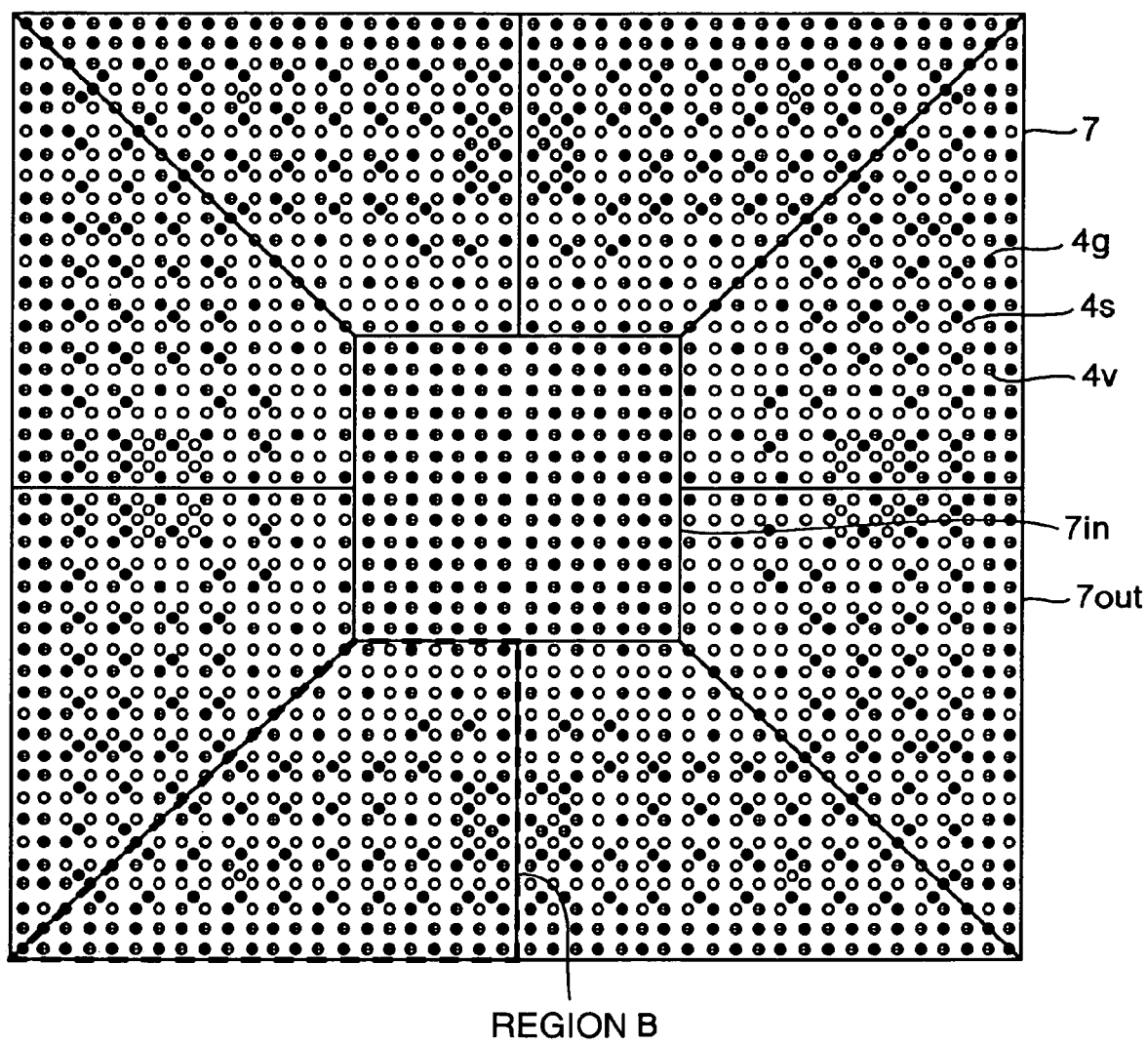
FIG. 8 is a plane view relating to an embodiment of the present invention.

FIG. 8 illustrates a layout of through holes in the core layer 7. The through holes 4 of the core layer 7 are disposed in a grid, and nonconsecutive through holes are disposed on boundaries between regions. The through hole grids are divided into an inside where potential is low and an outside where potential is high depending on the difference of potential of the power through hole. An inner through hole grid region is an inner power region 7in, while a through hole grid region outside the inner power region 7in is an outer signal region 7out. In the inner power region 7in, the through hole 4v and ground through hole 4g are alternately disposed adjacent to each other. In the outer signal region 7out, through holes which do not correspond to external terminals are provided between the grids of the through holes and are connected to the conductor layers 54 and 55 which are on or under the core layer, respectively.

A trapezoidal and grid-shaped through hole region B, which is a region including the signal through hole 4s out of a part that is separated by a straight line connecting opposite angles of a package and a line connecting a side of the package and its opposite side of the package (when this is not positioned at the boundary of the regions, a line that is formed at a nearest boundary), is one eighth of the outer signal region 7out, and is symmetric with another region which is one eighth of the outer signal region 7*out*. The line connecting the central part may be a perpendicular bisector of the sides of the package.

Figure 16:
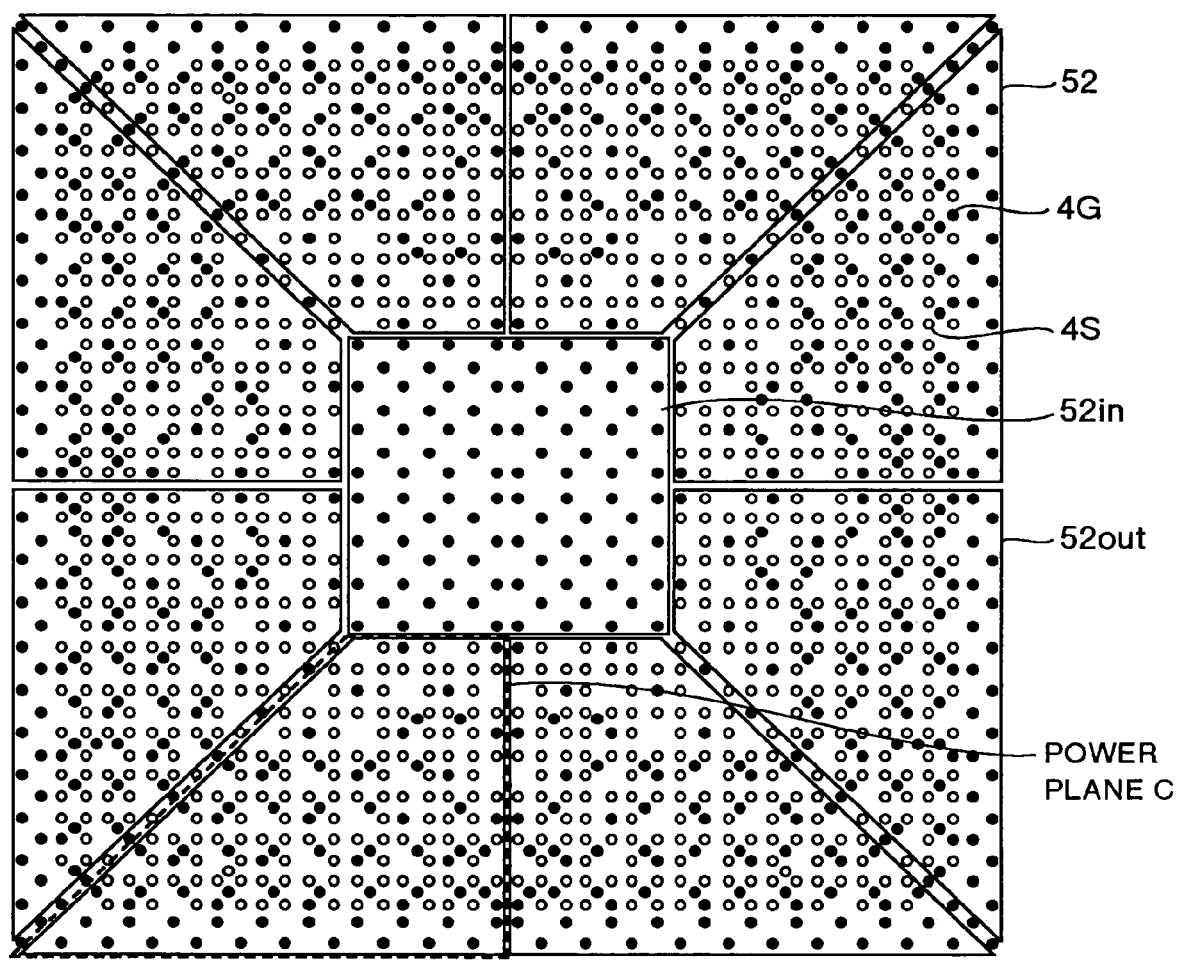
FIG. 16 is a plane view relating to an embodiment of the present invention.

FIG. 16 shows a pattern of the conductor layer 52, which is a power layer. The power layer has different power planes, and has an inner power plane 52*in* inside of the power layer and an outer power plane 52*out* outside the inner power plane 52*in*. The outer power plane 52*out* is divided into 8 trapezoidal power planes C. The power planes C are disposed at intervals. The inner power plane 52*in* and each of the outer power planes 52*out* are electrically independent, and are each capable to deal with power of different potentials. In the present embodiment, the inner power plane 52*in* deals with power of lower potential than the outer power planes 52*out*. Additionally, each plane has through hole pores corresponding to the through holes of the core layer 7. The pores corresponding to the signal through holes 4*s* are referred to as signal through hole pores 4S, while those corresponding to the ground through holes 4*g* are referred to as ground through hole pores 4G.

It is possible to regard the region B, shown in FIG. 8, as a trapezoidal through hole region in the core layer that includes a power through hole of the core layer 7 which is connected to the power planes C of the conductor layer 52 in the present embodiment.

Figure 10:
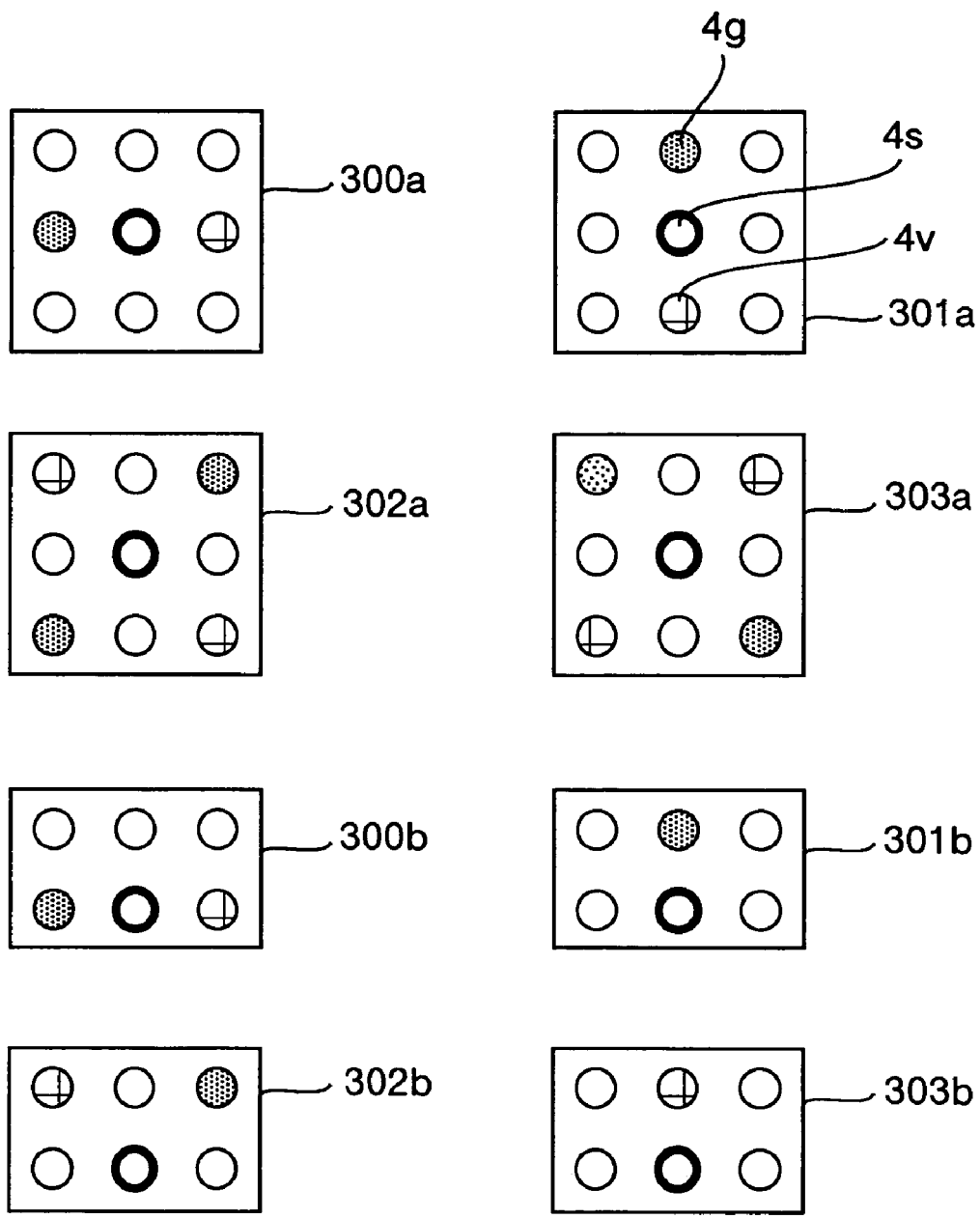
FIG. 10 is a plane view relating to the characteristics of the present invention.
Figure 11:
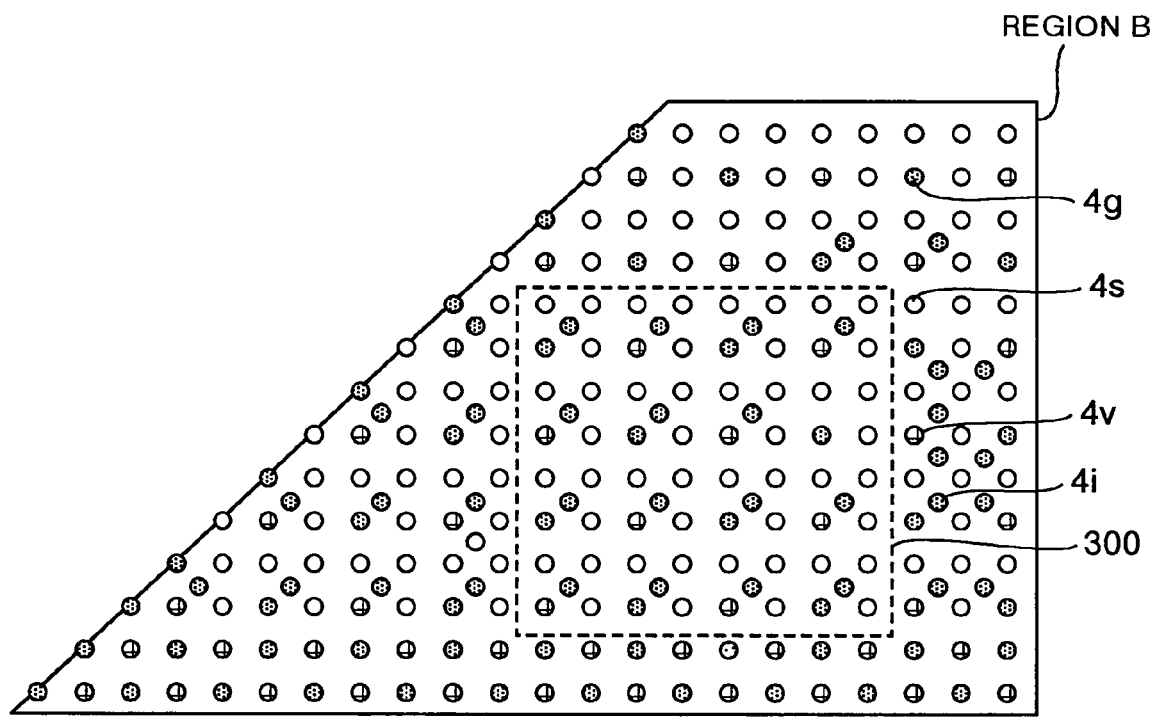
FIG. 11 is a plane view relating to an embodiment of the present invention.

The disposition of through holes in the region B includes a pattern region 300 shown in FIG. 11, which comprises a combination of a first signal unit of 300*a*, 300*b*, 301*a*, and 301*b*, and a second signal unit of 302*a*, 302*b*, 303*a*, and 303*b* which are shown in FIG. 10. The pattern region 300 is represented by 58 through hole grids in 8 strings. The signal through holes, and power and ground through holes are disposed in an optimum proportion of number in order to reduce the inductance. At least one power through hole 4*v* and one ground through hole 4*g* of a group of through holes are disposed such that they are adjacent to the signal through hole 4*s*. The pattern region 300 includes the signal through holes, power through holes, and ground through holes in the ratio of 6:1:1.

Figure 9:
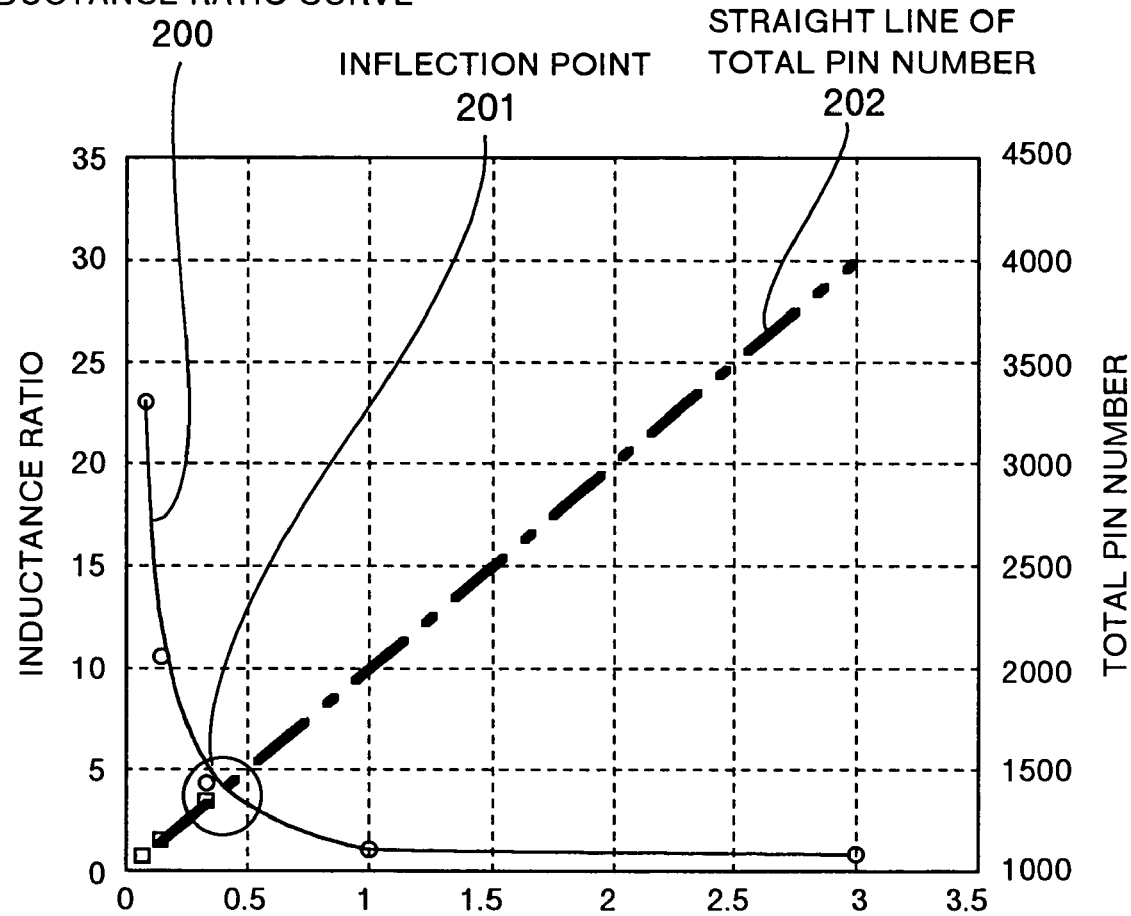
FIG. 9 is a graph diagram relating to the characteristics of the present invention.

The above ratio is taken because it is most effective in reducing the inductance. In FIG. 9, a total pin number straight line 202, which indicates the number of total pins when 1,000 signal through holes are required, intersects an inductance ratio curve 200, which indicates a ratio of the number of the power and ground through holes per one signal through hole, at an inflection point 201. The ratio of the number at this inflection point reduces the inductance most efficiently. The total pin number straight line 202 indicates how many pins including the power and ground through holes are needed when 1,000 signal through holes are required. The inductance ratio curve 200 indicates an inductance ratio per the ratio of the number of through holes assuming that when the ratio of the number of the power and ground through holes and the number of signal through holes is 1:1, the inductance is 1. It should be noted that inter-grid through holes (face-centered through holes) 4*i* may also be included.

In the first signal unit, a signal through hole 4*s* is disposed in the center surrounded by 8 through holes. One each of the power through hole 4*v* and the ground through hole 4*g* are disposed at positions horizontally and vertically adjacent to the signal through hole 4*s*. In the second signal unit, a signal through hole is disposed in the center surrounded by through hole strings. Two each of the power through holes 4*v* and the ground through holes 4*g* are disposed at positions diagonally adjacent to the signal through hole 4*s*. Vertically and horizontally symmetrical versions are also included. When the first signal unit and second signal unit lie on a boundary between regions, boundary signal units 300*b*, 301*b*, 302*b*, and 303*b* are used as the first or second signal units. The boundary signal units are units in which one vertical string or one horizontal string of the through holes is cut at a boundary of the region B. In FIG. 11, it is preferable that the number of the through holes laid out in the first signal unit or second signal unit accounts for a great majority among the through holes in the region B in order to improve effectiveness. Preferably, it should, for example, accounts for 70% or over. At least, it should hold the majority.

It is preferable that, for example, 70% or more of the through holes that are disposed in a region which is separated by a diagonal line of the base and a line connecting a central part of a side opposite to the main side, or a region between a through hole string that includes signal through holes on the most peripheral side and is disposed in a direction along a side opposite to the outer periphery, and a through hole string that includes signal through holes on the side nearest the center and is disposed in a direction along a side opposite to the outer periphery, are comprised of the through hole units.

Alternatively, 70% or more of the through holes, that are disposed in a region which is separated by a line which includes through holes that are parallel to the main side of the semiconductor element and are nearest the semiconductor element, a line which includes signal through holes that are parallel to the main side of the base opposite to the main side of the semiconductor element and are nearest the main side, and a line connecting both sides of the main side of the semiconductor element to a region nearest the main side of the base, constitute the through hole units. It should be noted that the through hole unit may include a region outside the foregoing region, and through holes in the region may constitute a part of the foregoing through hole unit.

A BGA semiconductor device functions to connect a semiconductor device and a board of an electronic device to transmit signals. Thus, if it is possible to densely contain as many signals as possible therein, a compact and low-cost unit can be realized. In order to mount signals more densely in the BGA semiconductor device which is limited in size, it is required to increase the proportion of the signal through holes in external terminals and to reduce the proportion of power and ground through holes. However, when the proportion of the power and ground through holes against the signal through holes is too small, there occurs a problem that inductance at the power and ground through holes increases, resulting in increased noise. Instantaneous switching noise, which causes a bottleneck to high-speed signal transmission, is greatly affected by the inductance of a power plane. Thus, the instantaneous switching noise can be reduced by reducing the inductance.

The semiconductor device of the present embodiment is provided with a through hole layout structure, which is made by clarifying a mechanism in which ground and power inductances increase, and thereby can effectively suppress the increase in inductance based on the mechanism. The through hole layout structure of the present embodiment enables averaging the difference of the length of the paths for uncombined current flowing in conductor layers, and suppressing the excessive concentration of the uncombined current into through holes. In this way, it is possible to reduce ground inductance and power inductance in the entire targeted region by reducing current paths for the uncombined current which has a large inductance. The reduction of inductance enables the reduction of the instantaneous switching noise and high-speed signal transmission with less noise.

Moreover, the above layout makes it possible to form high-density transmission paths for allowing the above high-speed transmission, and to form a high-density package. A total number of the external terminals which are required for the BGA semiconductor device so as to satisfy signal terminals needed for the semiconductor element is a sum of a signal terminal, a ground terminal and a power terminal, and a certain proportion of ground terminals, and power terminals are required. It is possible to reduce the proportion of the ground terminals and power terminals relative to the signal terminals more than before without deteriorating the transmission characteristics according to the present embodiment.

As a result, it is possible to suppress an increase in the number of the external terminals while increasing the number of the signal terminals, as well as to reduce the inductance of the power and ground. As described above, the present invention has an advantage that enables provision of a BGA semiconductor device which can be packaged at high densities, is low-priced, and smaller in noise.

Characteristics of the present invention will be given below. In the semiconductor device provided according to the present invention, a plurality of through holes are disposed around a signal through hole formed on a base on which a semiconductor element is mounted such that they connect the power or ground on the diagonal. The base comprises: a first through hole as a certain signal through hole; a first through hole string which includes the first through hole and is disposed in a first direction (horizontal direction in the paper plane); a second and a third through hole strings disposed in the first direction each adjacent to both sides of the first through hole string; a fourth through hole string that includes the first through hole and is disposed along a second direction, different from the first direction (perpendicular direction, for example); and a fifth and a sixth through hole strings disposed in the second direction each adjacent to both sides of the fourth through string, wherein the base has a through hole unit in which the power through hole and ground through hole are diagonally disposed at a point of intersection of the second through hole string, third through hole string, fifth through hole string, and sixth through hole string.

A through hole unit having the power and ground through holes which are disposed in positions adjacent to the direction in which the signal through hole grid is disposed is also provided. The base has a through hole unit which is formed such that through holes positioned adjacent to the first direction containing the first through hole therebetween are power through holes and ground through holes, through holes positioned adjacent to the second direction containing the first through hole therebetween are signal through holes, and through holes positioned at a point of intersection of the second through hole string, third through hole string, fifth through hole string, and sixth through hole string are signal through holes.

In addition, an example is described in which additional through holes are preferably provided between the grids. Here, 4*i* is provided as the inter-grid through hole. The through hole also has a conductive member therein. In the inter-grid through hole, the end of the through hole may be positioned more inwardly than the end of the through hole string that forms the grid. In this way, it is possible to dispose a through hole provided with a conductive member between the adjacent through holes. The ground through holes are added to the inter-grid through holes.

Figure 17:
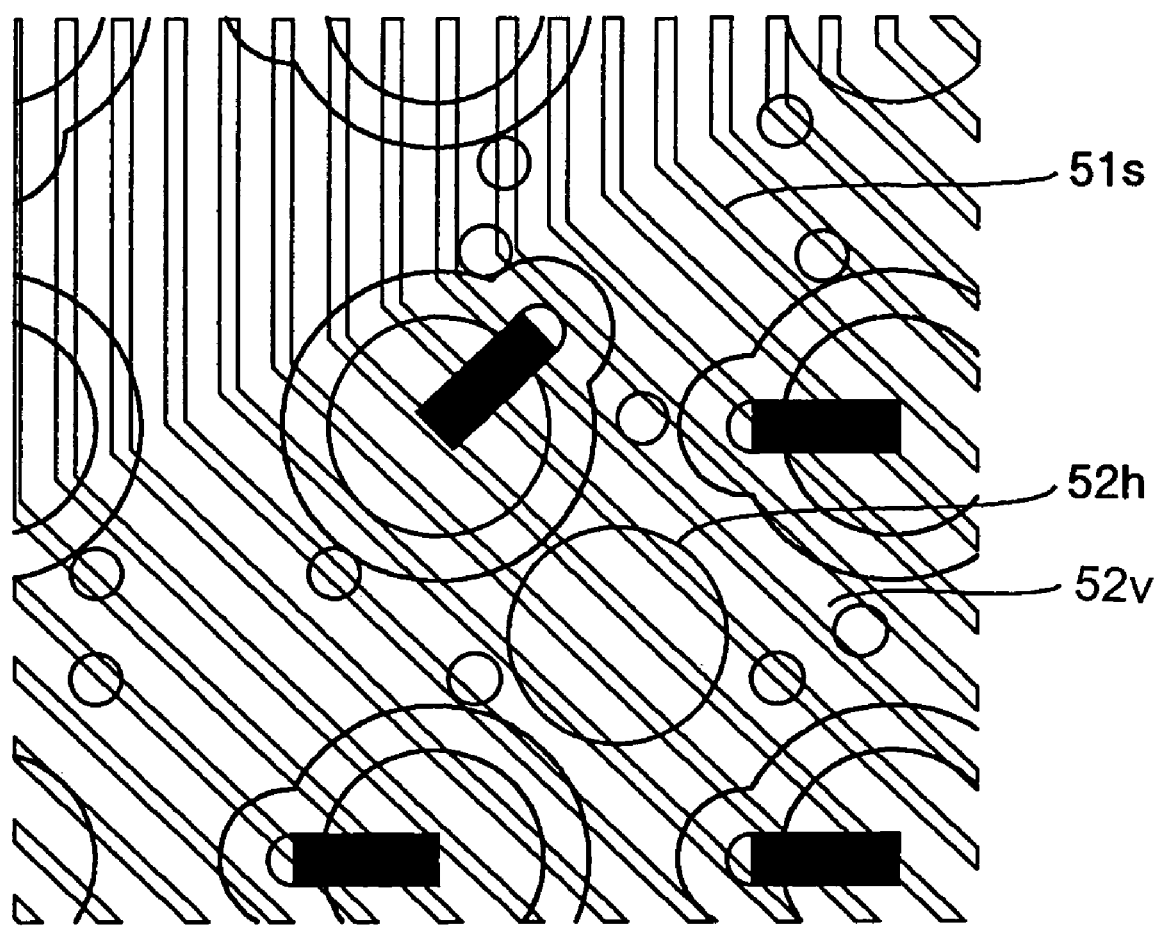
FIG. 17 is a plane view relating to an embodiment of the present invention.
Figure 18:
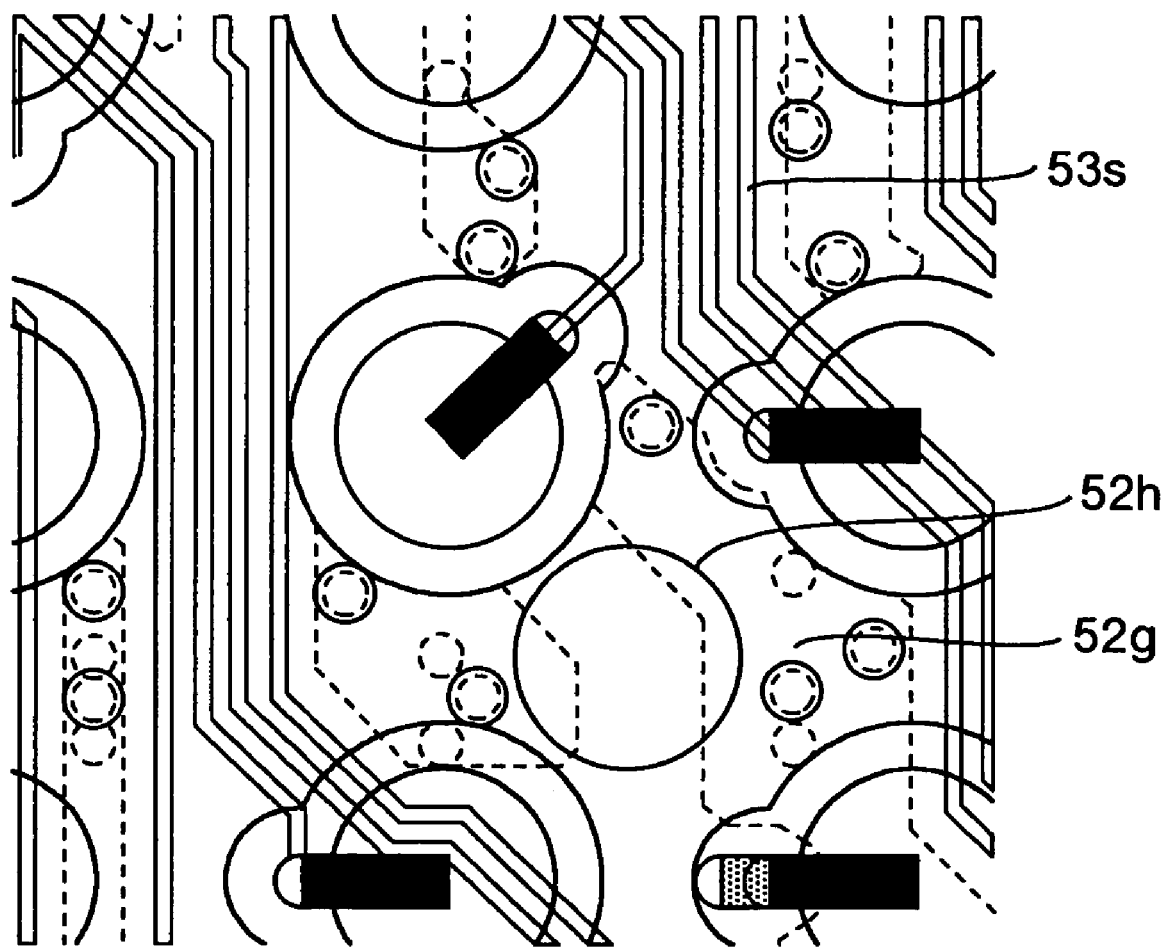
FIG. 18 is a plane view relating to an embodiment of the present invention.

With this, uncombined current 101 between the conductor layers 54 and 55 is dispersed, thus making it possible to reduce the inductance of the current path. In the present embodiment, it is preferable that many inter-grid through holes exist outside the external signal region with few existing inside. This is to prevent a change in impedance from occurring when a signal wiring of wiring layers above and below a solid layer passes on pores of the through hole inside the solid layer. FIG. 17 shows a positional relationship between the wiring and the pore of the through hole when the conductor layers 51 and 52 are overlapped. FIG. 18 shows a positional relationship between the wiring and the pore of the through hole when the conductor layers 52 and 53 are overlapped. In FIG. 17, wirings are so dense that they have to pass through the inter-grid through hole pores 52*h*, while in FIG. 18, the wirings are so coarse that they are designed to circumvent the through hole pore 52*h*. In this way, signal wiring of the wiring layer is so dense inside the external signal region that it is necessary to secure a space for wirings by reducing the through holes such that the wires are prevented from passing through the through holes. However, since the grid-shaped through holes correspond to the external terminals, they can not be reduced. Therefore, inter-grid through holes are reduced, instead. Outside the external signal region where wiring density is coarse, as many inter-grid through holes as possible are provided to reduce ground inductance, and power inductance. In FIGS. 17 and 18, reference numerals 51*s* and 53*s* denote a signal wiring and a reference numeral 52*v* denotes a power plane.

The conductor layers on and under the core layer are solid layers having the same potential, and ground inductance and power inductance are reduced by looping current above and beneath the core layer.

Since few signal wirings exist in the outermost two strings of through holes in the external signal region, signal through holes and power through holes are alternately disposed. In this manner, the concentration of return current, which causes an increase in inductance, is solved by increasing through holes, and thereby ground inductance and power inductance are reduced. Conductor layers 53, 56 are nearest the conductor layers 54 and 55 which are on or under the core layer. Portions of the conductor layers 53 and 56 that are immediately above or below the through holes of the conductor layers 54 and 55 are hollowed out in a circular shape. This is for the purpose of preventing the end of the through holes and conductor layer 53, 56 opposing the end of the through holes from having a large capacitance. It is conceived that when the capacitor is large, and wiring has parasitic capacitance, impedance is increased and transmission characteristics is deteriorated.

Embodiment 2 will be described below.

Figure 12:
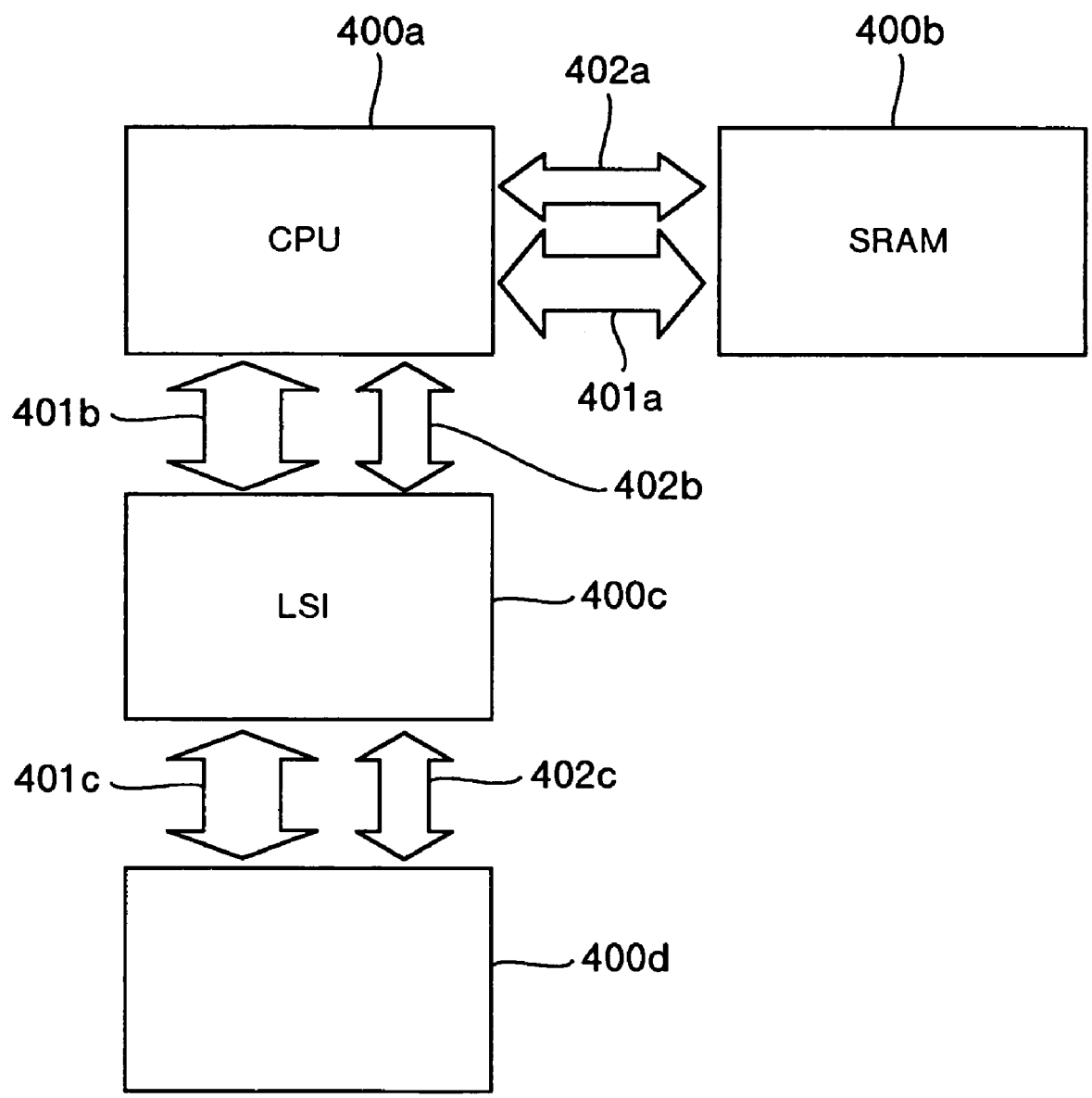
FIG. 12 is a plane view relating to an embodiment of the present invention.
Figure 13:
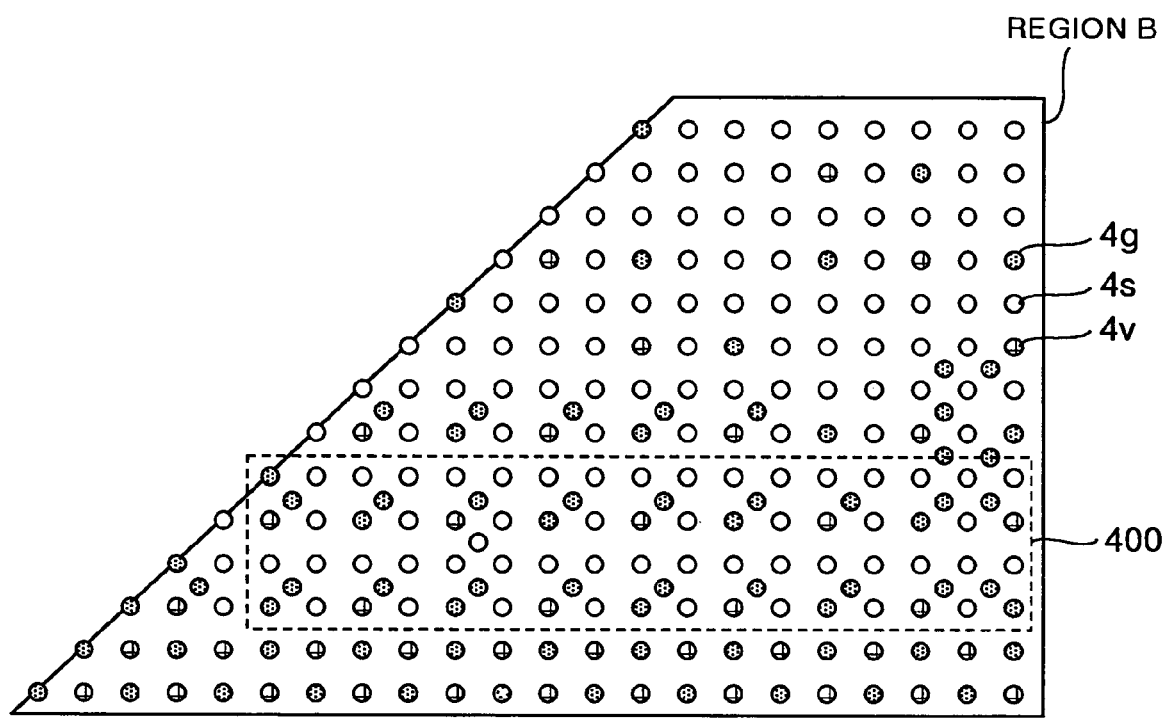
FIG. 13 is a plane view relating to an embodiment of the present invention.

Embodiment 2 may be identically configured with Embodiment 1. FIG. 13 shows Embodiment 2 of the BGA semiconductor device in which the layout of through holes of core layer is different. The core layer region B includes a high speed signal region 400, as shown in FIG. 13, which comprises a combination of the first signal units 300*a*, 300*b*, 301*a*, 301*b* and the second signal units 302*a*, 302*b*, 303*a*, 303*b* shown in FIG. 10. The ratio of signal through hole, power through hole, and ground through hole of the grid in the region is 6:1:1, which is due to the same reason as in the case of pattern region 300 in Embodiment 1. Inter-grid through holes may be included in the high-speed signal region. As FIG. 12 shows, transmission of signals to be transmitted among a CPU 400*a*, an SRAM 400*b*, an LSI 400c, and a memory 400d, which are semiconductor devices using the BGA semiconductor devices of the present embodiment, are divided into two groups depending on its use. One is a relatively low-speed signal transmission 1 (for transferring data signals, or clock signals in the present embodiment), 401a, 401b, and 401c, and the other is a relatively high-speed signal transmission 2 (for transferring address signal in the present embodiment), 402a, 402b, and 402C. The signal through holes which are used by the high-speed signal transmission 1 are collected in a region of the core layer. The region is referred to as a high-speed signal region 400 in this embodiment. In addition, it may be said that in FIG. 13, the signal through holes of the signal wiring used by the high-speed bus have the same through hole layout as that of the first signal unit or second signal unit.

If there is no problem in transferring clock signals by the low-speed transmission 2 due to a reason that the semiconductor device operates at a double-rate, or the like, then the BGA semiconductor device may be configured such that the low-speed signal transmission 2 is used for transferring address signals and clock signals, while the high-speed signal transmission 1 is used for transferring data signals. When precision is required for the clock, the BGA semiconductor device many be configured such that the low-speed signal transmission 2 is used for transferring the address signals and data signals, while the high-speed signal transmission 1 is used for transferring the clock signals so as to reduce noise in the clock signals.

More signal wirings are required in Embodiment 2 than in Embodiment 1. Therefore, it has been necessary to decrease the ground and power inside the external signal region in order to increase the signal wiring. This makes it difficult to adopt the first unit or second unit of layout in some signal through holes in contrast to Embodiment 1. However, in the semiconductor element used in the present embodiment, address signals are transferred using the transmission which is lower in speed than the transmission for data signals. Accordingly, in Embodiment 2, the data signals that request relatively high-speed transmission are collectively assigned to a high-speed signal region, while address signals that do not request high-speed transmission are assigned to other regions. Data signal transmission speed has conventionally been a problem to the overall processing speed in the semiconductor device. The present embodiment has solved the problem. The present embodiment enables high-speed data signal transmission, producing effectiveness in improving overall processing speed of the semiconductor device.

Embodiment 3 will be described below.

Figure 14:
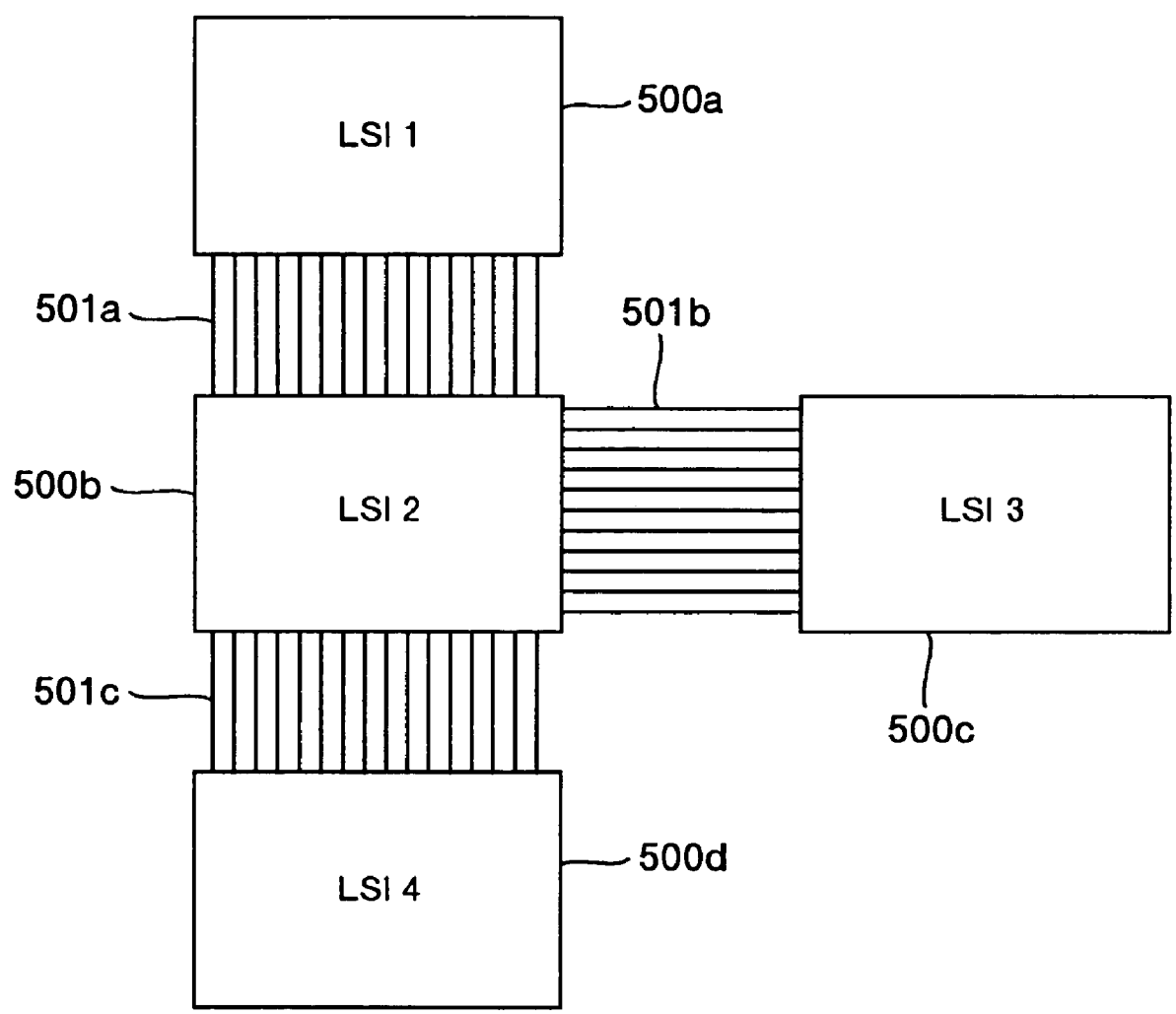
FIG. 14 is a plane view relating to an embodiment of the present invention.
Figure 15:
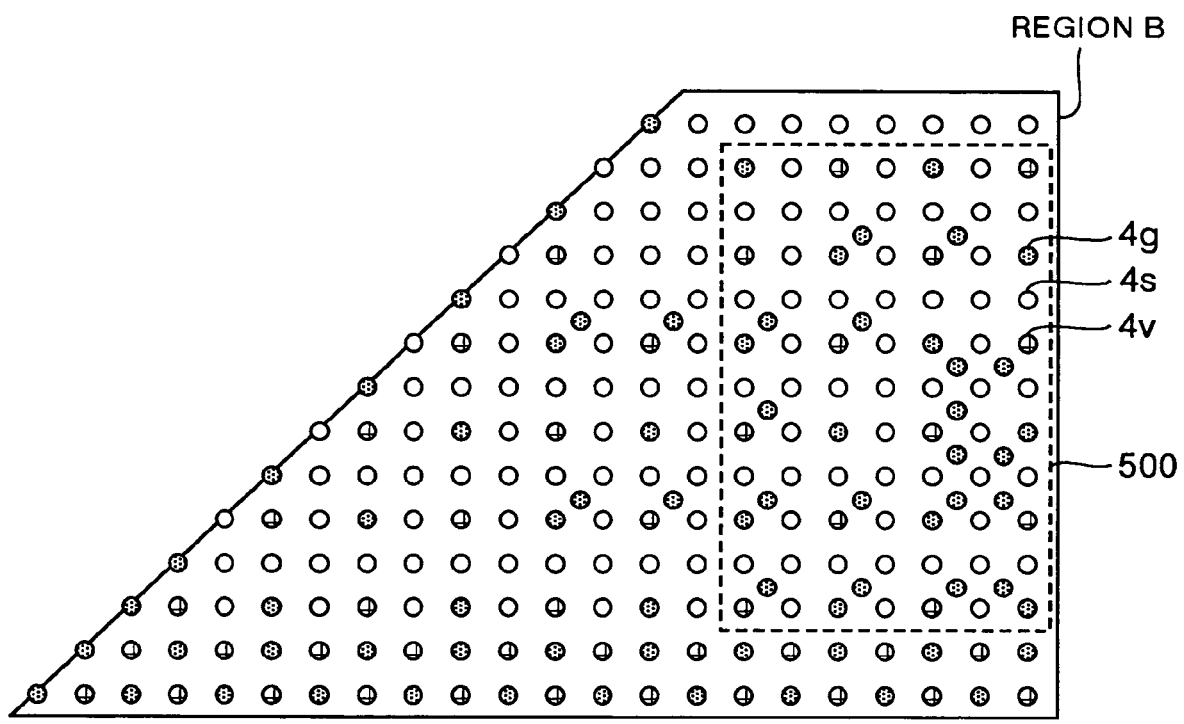
FIG. 15 is a plane view relating to an embodiment of the present invention.

Embodiment 3 may basically be configured similarly to Embodiment 1. FIG. 15 shows Embodiment 3 of the BGA semiconductor in which the layout of through holes in the core layer is different. A region B of the core layer includes a high-speed bus region 500 as shown in FIG. 15 which comprises a combination of the first signal unit including 300a, 300b, 301a, 301b, and the second signal unit including 302a, 302b, 303a, 303b. The ratio of signal through holes, power through holes, and ground through holes of the grid in the region is 6:1:1, which is due to the same reason as in the case of pattern region 300 in Embodiment 1. It should be noted that inter-grid through holes may be included in the high-speed region. As FIG. 14 shows, bus 1 501a, bus 2 501b, and bus 3 501c for transmitting a logical set of data which is dealt in one clock by LSI1 500a, LSI2 500b, LSI3 500c, and LSI4 500d, in which the BGA semiconductor of the present Embodiment 3 is used, are divided into a relatively low-speed bus (bus 3 in the present embodiment) and a relatively high-speed bus (bus 1 and bus 2 in the present embodiment). In the present Embodiment 3, bus 3 which is lowest in speed in the plurality of buses, buses 1, 2, 3 by which LSI2 performs transmission, is considered as a low-speed bus, while the bus 1, and bus 2 which are relatively high in speed compared with the bus 3 are considered as high-speed buses. Moreover, there may be other ways of consideration. When there exist a plurality of buses, one way is to consider the bus which is lowest in speed as a low-speed bus, and the remaining ones as high-speed buses. A second one is to consider the bus which is highest in speed as a high speed bus, and the remaining ones as low-speed busses. A third one is to consider half of the buses including one highest in speed as high-speed buses, and the remaining ones as low-speed buses. The signal through hole of the signal wirings used by the high-speed bus are intensively collected in a region in the core layer. The region is referred to as a high-speed bus region 500. In addition, it may be said that in FIG. 15, the signal through holes of the signal wiring used by the high-speed bus have the same through hole layout as that of the first signal unit or second signal unit.

In Embodiment 3, it is necessary for the semiconductor device to process a plurality of buses at high speed, and there is a big difference of transmission speed between buses. Therefore, in contrast to Embodiment 1, the layout of the first signal unit or second signal unit is adopted to the signal through holes of signal wiring that are used in the high-speed bus, while the layout of the unit is not adopted to the signal through holes that are used in the low-speed buses, and peripheral inter-grid through holes are eliminated. This allows increasing the proportion of the number of signal through holes relative to the entire number of through holes, and decreasing the number of inter-grid through holes, thereby making it possible to reduce manufacturing costs.

The BGA semiconductor device described here refers to a semiconductor device in which current flows from the top surface of the base through the through holes to the bottom surface. Therefore, the number of the semiconductor elements to be mounted on the semiconductor device is not limited to one. It is evident that the present invention is applicable to MCM (Multi Chip Module) and the like.

As described above, in the BGA semiconductor device of the present embodiments, the signal through holes, power through holes and ground through holes are disposed in an optimum proportion in their number, and in an optimum pattern. Thus, according to the present invention, it is possible to provide a BGA semiconductor device at low costs that can reduce inductance as well as electric noise without increasing the number of the ground through holes and power through holes.

According to the present invention, it is possible to provide a compact semiconductor device that is capable of suppressing noise to perform high-speed transmission.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device having a semiconductor element, and a base which includes said semiconductor element mounted on the main surface thereof and external terminals provided on a surface opposite to said main surface, said base having a region where multiple grid-shaped through holes comprising a conductive member for electrically connecting the main surface and the opposing surface are disposed, wherein:

said through holes includes: a signal through hole; a first power through hole of a first potential; and a second power through hole of a second potential which is lower than said first potential;

said base comprises: a first through hole; a first through hole string which includes the first through hole and is disposed in a first direction; a second through hole string and a third through hole string which are disposed in said first direction each adjacent to both sides of said first through hole string; a fourth through hole string which includes said first through hole and is disposed in a second direction, different from the first direction; and a fifth through hole string and a sixth through hole string which are disposed in said second direction each adjacent to both sides of said fourth through hole string; and said base further has a through hole unit formed such that a first power through hole and a second power through hole are diagonally disposed at the through holes positioned at an intersection point of said second through hole string, said third through hole string, said fifth through hole string and said sixth through hole string.

2. The semiconductor device according to claim 1, wherein a through hole adjacent to the first signal through hole in said first direction is a signal through hole, and a through hole adjacent to the first signal through hole in said second direction is a signal through hole.

3. The semiconductor device according to claim 1, wherein an additional through hole comprising a conductive member is disposed between said adjacent through holes.

4. The semiconductor device according to claim 3, wherein a second power signal through hole is disposed on said additional through hole string.

5. The semiconductor device according to claim 1, wherein 70% or more of the through holes, which are disposed in a region that is separated by a diagonal line of the base and a line connecting a central part of a side opposite to the main side, or a region between a through hole string that includes the most peripheral signal through holes and is disposed in a direction along a side opposite to said outer periphery, and a through hole string that includes signal through holes nearest the center and is disposed in a direction along a side opposite to said outer periphery, constitute the through hole unit.

6. A semiconductor device having a semiconductor element, and a base which includes the semiconductor element mounted on said main surface thereof and external terminals provided on a surface opposite to said main surface, said base having a region where multiple grid-shaped through holes comprising a conductive member for electrically connecting said main surface and said opposing surface are disposed, wherein:

said through holes includes: a signal through hole; a first power through hole of a first potential; a second power through hole of a second potential which is lower than said first potential;

said base has: a first through hole unit comprising the signal through hole; a first power signal through hole; and a second power signal through hole;

said first through hole unit comprises: a first through hole; a first through hole string which includes said first through hole and is disposed in a first direction; a second through hole string and a third through hole string which are disposed in said first direction each adjacent to both sides of said first through hole string; a fourth through hole string which includes said first through hole and is disposed in a second direction, different from the first direction; and a fifth through hole string and a sixth through hole string which are disposed in said second direction each adjacent to both sides of said fourth through hole string;

the first power through hole and the second power through hole are diagonally disposed at the through holes positioned at an intersection point of said second through hole string, said third through hole string, said fifth through hole string and said sixth through hole string;

said base has a second through hole unit which comprises: a second through hole; a seventh through hole string which includes said second through hole and is disposed in a first direction; a eighth through hole string and a ninth through hole string which are disposed in said first direction each adjacent to both sides of said seventh through hole string; a tenth through hole string which includes said second through hole and is disposed in said second direction; and a eleventh through hole string and a twelfth through hole string which are disposed in said second direction each adjacent to both sides of said tenth through hole string;

the first power through hole and the second power through hole are diagonally disposed at the through holes positioned at an intersection point of said eighth through hole string, said ninth through hole string, said eleventh through hole string, and said twelfth through hole string; and the through hole constituting one side of said first through hole unit and the through hole constituting said second through hole unit are disposed such that they are common.

7. A semiconductor device having a semiconductor element, and a base which includes said semiconductor element mounted on the main surface thereof and external terminals provided on a surface opposite to the main surface, said base having a region where multiple grid-shaped through holes comprising a conductive member for electrically connecting said main surface and said opposing surface are disposed, wherein:

said through holes comprises: a signal through hole; a first power through hole of a first potential; and a second power through hole of a second potential which is lower than said first potential;

said base has: a region where a through hole unit including a signal through hole, a first power signal through hole, and a second power through hole is formed; and a region where the said unit is not formed;

said a through hole unit comprises: a first through hole; a first through hole string which includes said first through hole and is disposed in a first direction; a second through hole string and a third through hole string which are disposed in said first direction each adjacent to both sides of said first through hole string; a fourth through hole string which includes said first through hole and is disposed in a second direction, different from said first direction; and a fifth through hole string and a sixth through hole string which are disposed in said second direction each adjacent to both sides of said fourth through hole string;

a first power through hole and a second power through hole are diagonally disposed at the through holes positioned at an intersection point of said second through hole string, said third through hole string, said fifth through hole string and said sixth through hole string; and said base includes a region which is disposed such that a data signal or a clock signal flows to the through holes constituting said first through unit, and an address signal flows to the through hole constituting a region where said through hole unit is not formed.

8. A semiconductor device having a semiconductor element, and a base which includes said semiconductor element mounted on the main surface thereof and external terminals provided on a surface opposite to the main surface, said base having a region where multiple grid-shaped through holes comprising a conductive member for electrically connecting said main surface and said opposing surface are disposed, wherein:

said through holes comprises: a signal through hole; a first power through hole of a first potential; and a second power through hole of a second potential which is lower than said first potential;

said base comprises: a first through hole; a first through hole string which includes said first through hole, and is disposed in a first direction; a second through hole string and a third through hole string which are disposed in said first direction each adjacent to both sides of said first through hole string; a fourth through hole string which includes said first through hole and is disposed in a second direction, different from said first direction; and a fifth through hole string and a sixth through hole string which are disposed in said second direction each adjacent to both sides of said fourth through hole string; and said base has a through hole unit which is formed such that through holes positioned adjacent to said first direction containing said first through hole therebetween are said first power through hole and said second power through hole; a through hole positioned adjacent to said second direction containing said first through hole therebetween is a signal through hole; a through hole positioned at an intersection point of said second through hole string, said third through hole string, said fifth through hole string, and said sixth through hole string is a signal through hole.

9. A semiconductor device having a semiconductor element, and a base which includes said semiconductor element mounted on the main surface thereof and external terminals provided on a surface opposite to the main surface, said base having a region where multiple grid-shaped through holes comprising a conductive member for electrically connecting the main surface and the opposing surface are disposed, wherein:

said through holes comprises: a signal through hole; a first power through hole of a first potential; and a second power through hole of a second potential which is lower than said first potential;

said base comprises: a first through hole; a first through hole string which includes the said first through hole, and is disposed in a first direction; a second through hole string and a third through hole string which are disposed in said first direction each adjacent to both sides of said first through hole string; a fourth through hole string which includes said first through hole and is disposed in a second direction, perpendicular to the first direction; and a fifth through hole string and a sixth through hole string which are disposed in said second direction each adjacent to both sides of said fourth through hole string; and said second through hole string, third through hole string, fifth through hole string, and sixth through hole string have a region where a second signal through hole is disposed to a fist signal through hole via a first power through hole, and a third power through hole is disposed to said second signal through hole via a second power through hole; wherein:

said region has an area where one first power through hole of said second through hole string, and one second power through hole of said third through hole string are disposed adjacent to one signal through hole of said first through hole string; and said region has an area where one first power through hole of said fifth through hole, and one second power through hole of said sixth through hole string are disposed adjacent to one signal through hole of said fourth through hole string.

10. The semiconductor device according to claim 9, wherein said base has a resin core layer, and a surface layers which are formed adjacent to said core layer, and comprises a plurality of resin thin films formed with conductive wiring layers, and said through hole has a region where multiple said grid-shaped through holes are provided.

11. A semiconductor device having a semiconductor element, and a base which includes said semiconductor element mounted on the main surface thereof and external terminals provided on a surface opposite to the main surface, the base having a region where multiple grid-shaped through holes comprising a conductive member for electrically connecting the main surface and the opposing surface are disposed, wherein:

said through hole comprises: a signal through hole; a first power through hole of a first potential; and a second power through hole of a second potential which is lower than said first potential;

the said through hole has a first signal unit in which a first power through hole and a second power through hole are each disposed in a position along a first signal through hole and a grid string of said first signal through hole in the through holes disposed at a position most close to and surrounding said first signal through hole; wherein, a second signal through hole unit, and an angle portion of the through hole which is disposed at a position most close to and surrounding said first through hole comprise a first power through hole and a second power through hole; and the said through hole further has said first through hole unit and said second through hole unit in a region between each side of said semiconductor element on said base and the opposite periphery of the base.

12. The semiconductor device according to claim 11, wherein 70% or more of the through holes that are disposed in a region which is separated by a diagonal line of the base and a line connecting a central part of a side opposite to the main side, or a region between a through hole string that includes signal through holes on the most peripheral side and is disposed in a direction along a side opposite to the outer periphery, and a through hole string that includes signal through holes nearest the center and is disposed in a direction along a side opposite to the outer periphery, constitute the through hole unit.

* * * * *